US011245215B2

(12) United States Patent
You et al.

(10) Patent No.: US 11,245,215 B2
(45) Date of Patent: Feb. 8, 2022

(54) CONNECTOR FOR DISPLAY DEVICE

(71) Applicant: SAMSUNG DISPLAY CO., LTD., Yongin-si (KR)

(72) Inventors: Jinyoung You, Cheonan-si (KR); Sangyoon Lee, Pohang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 69 days.

(21) Appl. No.: 16/578,886

(22) Filed: Sep. 23, 2019

(65) Prior Publication Data
US 2020/0161792 A1 May 21, 2020

(30) Foreign Application Priority Data

Nov. 20, 2018 (KR) .................. 10-2018-0143425

(51) Int. Cl.
*H01R 13/28* (2006.01)
*H01R 12/77* (2011.01)
*H01R 12/70* (2011.01)

(52) U.S. Cl.
CPC ......... *H01R 13/28* (2013.01); *H01R 12/7076* (2013.01); *H01R 12/77* (2013.01); *H01R 2201/06* (2013.01)

(58) Field of Classification Search
CPC .... H01R 13/28; H01R 12/7076; H01R 12/77; H01R 2201/06; H01R 12/777; H01R 12/65; H01R 12/778; H01R 12/7064
See application file for complete search history.

(56) References Cited

U.S. PATENT DOCUMENTS

| 5,110,298 | A  | * | 5/1992  | Dorinski ................. H01L 24/10 439/55 |
| 7,281,954 | B1 |   | 10/2007 | Hashiguchi |
| 7,785,113 | B2 | * | 8/2010  | Mizoguchi ............ H01R 12/79 439/67 |
| 7,845,958 | B2 | * | 12/2010 | Hoshino ............ H01R 12/7082 439/74 |
| 8,134,676 | B2 | * | 3/2012  | Shim .................. H01R 12/7076 349/150 |
| 8,481,855 | B2 | * | 7/2013  | Shinoda ................ H05K 1/147 174/71 R |
| 9,095,069 | B2 | * | 7/2015  | Stefanoff ............... H05K 3/403 |
| 9,153,892 | B2 |   | 10/2015 | Tanaka et al. |
| 9,614,334 | B2 | * | 4/2017  | Chen ...................... H01R 24/84 |
| 10,630,004 | B2 | * | 4/2020 | Hashiguchi ............ H01R 12/79 |

(Continued)

FOREIGN PATENT DOCUMENTS

JP 4252066 B2 4/2009
JP 5884036 B2 3/2016

(Continued)

*Primary Examiner* — Renee S Luebke
*Assistant Examiner* — Paul D Baillargeon
(74) *Attorney, Agent, or Firm* — Cantor Colburn LLP

(57) ABSTRACT

A connector for a display device is capable of visually detecting defects when an FPCB is connected to a PCB in the display device, e.g., a tablet and a smart phone. The connector includes a first gaff-type connection portion disposed at one end portion of a flexible printed circuit board, and a second gaff-type connection portion disposed at one end portion of a printed circuit board and fitted to the first gaff-type connection portion.

22 Claims, 13 Drawing Sheets

(56) References Cited

U.S. PATENT DOCUMENTS

| | | | | |
|---|---|---|---|---|
| 2009/0044969 A1* | 2/2009 | Ishii | ............... | H05K 3/363 |
| | | | | 174/255 |
| 2012/0149246 A1* | 6/2012 | Iida | ............... | H01R 12/62 |
| | | | | 439/660 |
| 2014/0017940 A1* | 1/2014 | Chen | ............ | H01R 13/6477 |
| | | | | 439/607.02 |
| 2018/0151270 A1* | 5/2018 | Huang | ............ | H01R 12/613 |
| 2018/0205171 A1 | 7/2018 | Dean | | |

FOREIGN PATENT DOCUMENTS

| | | | |
|---|---|---|---|
| JP | 5945766 | B2 | 7/2016 |
| KR | 101164362 | B1 | 7/2012 |

\* cited by examiner

CONNECTOR FOR DISPLAY DEVICE

CROSS-REFERENCE TO RELATED APPLICATION

This application claims priority to Korean Patent Application No. 10-2018-0143425, filed on Nov. 20, 2018, and all the benefits accruing therefrom under 35 U.S.C. § 119, the content of which in its entirety is herein incorporated by reference.

1. TECHNICAL FIELD

Exemplary embodiments of the invention relate to a connector for a display device, and more particularly, to a connector for a display device that connects a flexible printed circuit board ("FPCB") and a printed circuit board ("PCB") that are used in the display device, e.g., a tablet and a smart phone.

2. DISCUSSION OF RELATED ART

In general, a flat panel display device such as a liquid crystal display ("LCD") device or an organic light emitting diode ("OLED") display device may include a touch unit that is formed on a display panel for displaying images in an on-cell type, or may include a touch panel that is disposed on the display panel.

In such flat panel display devices, an FPCB that is connected to the touch unit (a touch-type FPCB) is connected to the PCB that includes a driving integrated circuit ("IC") through a connector so as to transmit an input signal of the touch unit to the driving IC.

Connectors of a zero insertion force ("ZIF") type have been largely used, but due to release of the connector or a mold, they are replaced with a board to board ("B-to-B") type.

SUMMARY

In the case of the touch-type FPCB, a display device is shipped in a state where the B-to-B type connector is coupled to the PCB, and thus defects that may occur after inspection may not be visually identified.

In addition, since the B-to-B type connector is coupled in a manner using a header and a socket, it is almost impossible to detect defects by appearances, and when there is an operational error after the product is shipped, the connector is detached to find that it is defective.

Accordingly, there is a need for a method that may visually detect a connection failure when connecting the touch-type FPCB to the PCB before shipping the product.

Exemplary embodiments of the invention may be directed to a connector for a display device that is capable of visually detecting defects when a flexible printed circuit board ("FPCB") is connected to a printed circuit board ("PCB") in the display device, e.g., a tablet and a smart phone.

According to an exemplary embodiment, a connector for a display device includes a first gaff-type connection portion disposed at one end portion of a flexible printed circuit board, and a second gaff-type connection portion disposed at one end portion of a printed circuit board and fitted to the first gaff-type connection portion.

In an exemplary embodiment, the first gaff-type connection portion may include a first web portion which extends from the flexible printed circuit board, a first flange portion bent from the first web portion, and a second web portion bent from the first flange portion. The second gaff-type connection portion may include a third web portion which extends from the printed circuit board, a second flange portion bent from the third web portion, and a fourth web portion bent from the second flange portion. The first web portion, the first flange portion, and the second web portion may be fitted to the third web portion, the second flange portion, and the fourth web portion.

In an exemplary embodiment, at least one of the first web portion, the first flange portion, and the second web portion may include a first prominence portion which protrudes from a side surface thereof. At least one of the third web portion, the second flange portion, and the fourth web portion may define a first recessed portion fitted to the first prominence portion.

In an exemplary embodiment, the first prominence portion may include a plurality of first connection terminals arranged at regular intervals. The first recessed portion may include a plurality of first connection recesses arranged at regular intervals and which accommodates the plurality of first connection terminals.

In an exemplary embodiment, each of the plurality of first connection terminals and the plurality of first connection recesses may have one of a polygonal columnar shape, a circular columnar shape, and a semicircular columnar shape.

In an exemplary embodiment, each of the plurality of first connection terminals and the plurality of first connection recesses may be coated with a metal including a conductive material.

In an exemplary embodiment, a thickness of each of the plurality of first connection terminals may be less than or substantially equal to a thickness of each of the first web portion, the first flange portion, and the second web portion.

In an exemplary embodiment, at least one of the first web portion, the first flange portion, and the second web portion may define a second recessed portion recessed at a side surface thereof. At least one of the third web portion, the second flange portion, and the fourth web portion may include a second prominence portion which protrudes from a side surface thereof and may be fitted to the second recessed portion.

In an exemplary embodiment, the second prominence portion may include a plurality of second connection terminals which protrudes and is arranged at regular intervals. The second recessed portion may include a plurality of second connection recesses arranged at regular intervals and which accommodates the plurality of second connection terminals.

In an exemplary embodiment, at least one of the first web portion, the first flange portion, and the second web portion may define a fourth recessed portion recessed at an upper surface thereof. At least one of the third web portion, the second flange portion, and the fourth web portion may include a fourth prominence portion which protrudes from a side portion thereof and may be fitted to the fourth recessed portion.

In an exemplary embodiment, the fourth prominence portion may include a plurality of fourth connection terminals which protrudes and is arranged at regular intervals. The fourth recessed portion may include a plurality of fourth connection recesses arranged at regular intervals and which accommodates the plurality of fourth connection terminals.

In an exemplary embodiment, a thickness of each of the plurality of fourth connection terminals may be less than a thickness of each of the third web portion, the second flange portion, and the fourth web portion.

According to another exemplary embodiment, a connector for a display device includes a first connection portion disposed at a flexible printed circuit board, and a second connection portion disposed at a printed circuit board and fitted to the first connection portion. One of the first connection portion and the second connection portion includes a third prominence portion arranged at regular intervals. The other of the first connection portion and the second connection portion defines an accommodation recessed portion for accommodating the third prominence portion.

In an exemplary embodiment, each of the first connection portion and the second connection portion may have one of a plate shape and a gaff shape.

In an exemplary embodiment, the first connection portion may include an extension portion which extends from the flexible printed circuit board and has a plate shape. The second connection portion may include a third web portion which extends from the printed circuit board, a second flange portion bent from the third web portion, and a fourth web portion bent from the second flange portion, and define the accommodation recessed portion for accommodating the third prominence portion on the third web portion, the second flange portion, and the fourth web portion. The third prominence portion may be fitted to the accommodation recessed portion.

In an exemplary embodiment, the third prominence portion may include a plurality of third connection terminals which protrudes and is arranged at regular intervals on the extension portion. The accommodation recessed portion may include a plurality of third connection recesses arranged at regular intervals and which accommodates the plurality of third connection terminals.

According to another exemplary embodiment, a connector for a display device includes a first flat-type connection portion which includes a plurality of fifth connection terminals arranged on at least one side thereof at regular intervals along a longitudinal direction, and a second flat-type connection portion which defines an accommodation recess for accommodating the first flat-type connection portion, and includes a plurality of sixth connection terminals in the accommodation recess, the plurality of sixth connection terminals contacting the plurality of fifth connection terminals.

In an exemplary embodiment, the fifth connection terminals may be arranged at regular intervals along the longitudinal direction in an alternating manner on one side and an opposite side of the first flat-type connection portion.

In an exemplary embodiment, a height and a width of the fifth connection terminal may be substantially equal to a height and a width of the sixth connection terminal, respectively.

In an exemplary embodiment, a width of the first flat-type connection portion along the longitudinal direction may be greater than a width of the accommodation recess along the longitudinal direction.

In an exemplary embodiment, a thickness of the first flat-type connection portion may be greater than or substantially equal to a depth of the accommodation recess.

In an exemplary embodiment, the connector for a display device may further include a securing portion which protrudes from one of the first flat-type connection portion and the second flat-type connection portion, and a securing hole defined at the other of the first flat-type connection portion and the second flat-type connection portion and accommodates the securing portion.

In an exemplary embodiment, the securing portion may include a supporter which protrudes from one side of the first flat-type connection portion, and an elastic sub-securing portion which extends from the supporter and has a diameter which decreases along a direction away from the first flat-type connection portion.

In an exemplary embodiment, the supporter may be disposed in the securing hole, and the elastic sub-securing portion may protrude from one surface of the second flat-type connection portion.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, wherein.

DETAILED DESCRIPTION

Figure 1:
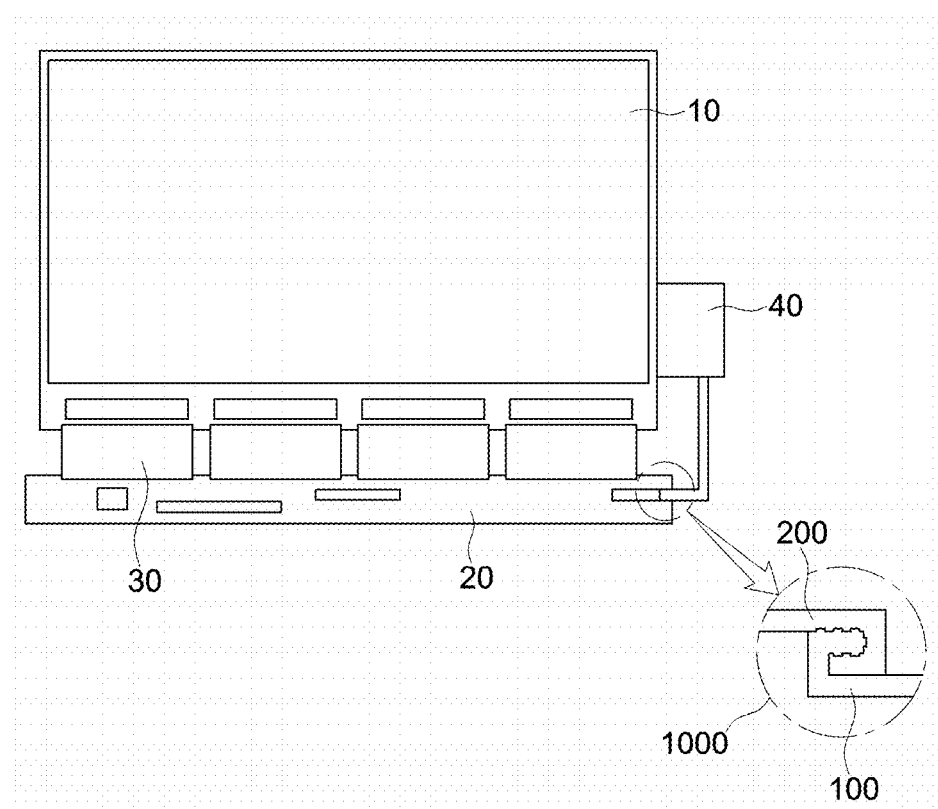
FIG. 1 is a view illustrating a display device to which a connector for a display device according to an exemplary embodiment is applied.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe exemplary embodiments and like reference numerals refer to like elements throughout the specification.

Hereinafter, a connector for a display device according to an exemplary embodiment will be described in detail with reference to FIGS. 1 to 13.

FIG. 1 is a view illustrating a display device to which an exemplary embodiment of a connector for a display device according to the invention is applied.

Referring to FIG. 1, a connector 1000 for a display device according to an exemplary embodiment includes a first gaff-type connection portion 100 disposed at a flexible printed circuit board ("FPCB") 40, and a second gaff-type connection portion 200 disposed at a printed circuit board ("PCB") 20 and fitted to the first gaff-type connection portion 100 (i.e., coupled with the first gaff-type connection portion 100 into place).

In such an exemplary embodiment, the FPCB 40 is an FPCB for a touch screen panel ("TSP") that is used to transmit a touch sensing signal. Herein, the FPCB 40 will be referred to as a touch FPCB 40 or an FPCB 40.

A display device to which the connector 1000 for a display device according to an exemplary embodiment is applied includes a display area 10, the PCB 20, a main FPCB 30, the FPCB 40, and the connector 1000 for a display device.

A display device is provided into an on-cell type in which a touch unit (not illustrated) is disposed on a display panel (not illustrated) in the display area 10, and a touch signal is received through the touch unit. A plurality of pixels are disposed at the display area 10 to display images.

The PCB 20 includes a driving integrated circuit ("IC") for applying a driving signal to the display area 10, and receives the touch signal from the touch unit of the display area 10. The driving IC may include, for example, a panel driver and a touch driver. The touch unit recognizes a touch by a touch means, such as a pen or a user's finger, and transmits a signal corresponding to a position of the touch to the touch driver. The touch unit is used as an input means for the display area 10, and may be provided as a pressure sensitive type or a capacitive type.

The main FPCB 30 connects the display area 10 and the PCB 20, and transmits the driving signal from the driving IC to the display area 10.

The FPCB 40 connects the touch unit of the display area 10 with the PCB 20 through the connector 1000 for a display device, and outputs the touch signal from the touch unit of the display area 10 to the PCB 20.

That is, the connector 1000 for a display device allows the first gaff-type connection portion 100 of the FPCB 40 and the second gaff-type connection portion 200 of the PCB 20 to be fitted to each other, and thus electrically connects the FPCB 40 and the PCB 20.

Figure 2:
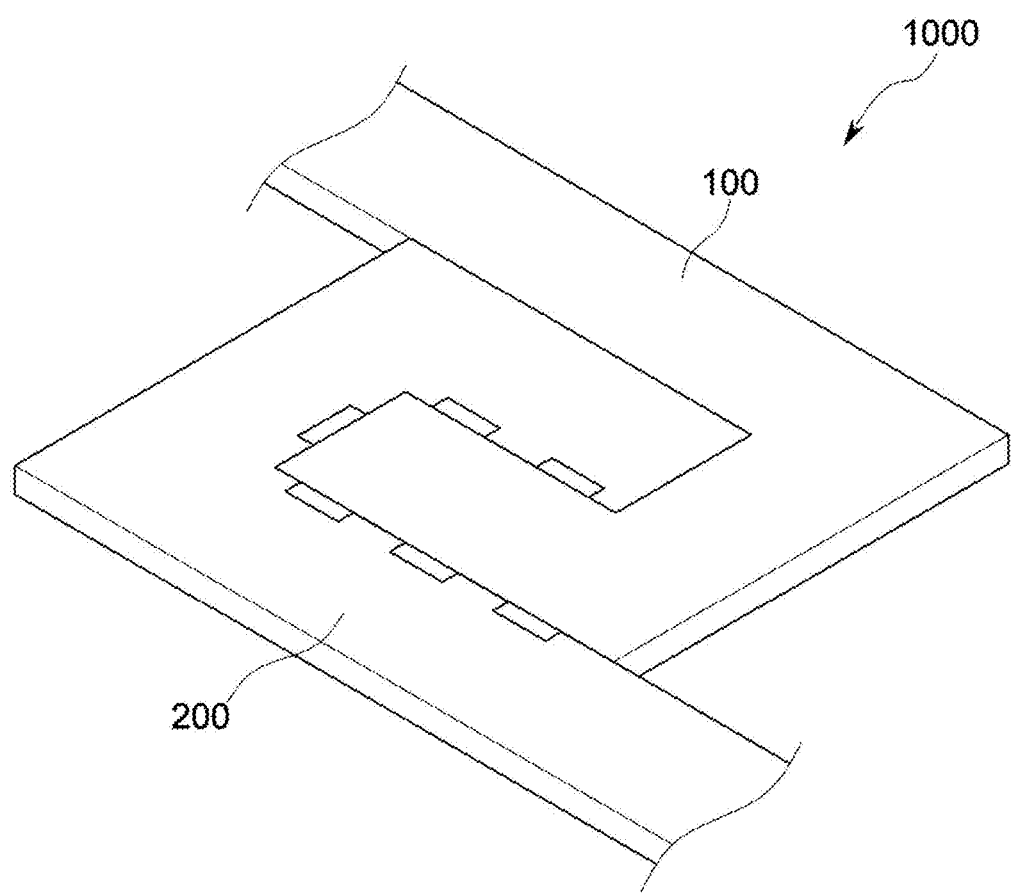
FIG. 2 is a view illustrating a state in which a first gaff-type connection portion and a second gaff-type connection portion of a connector for a display device according to an exemplary embodiment are fitted to each other.
Figure 3:
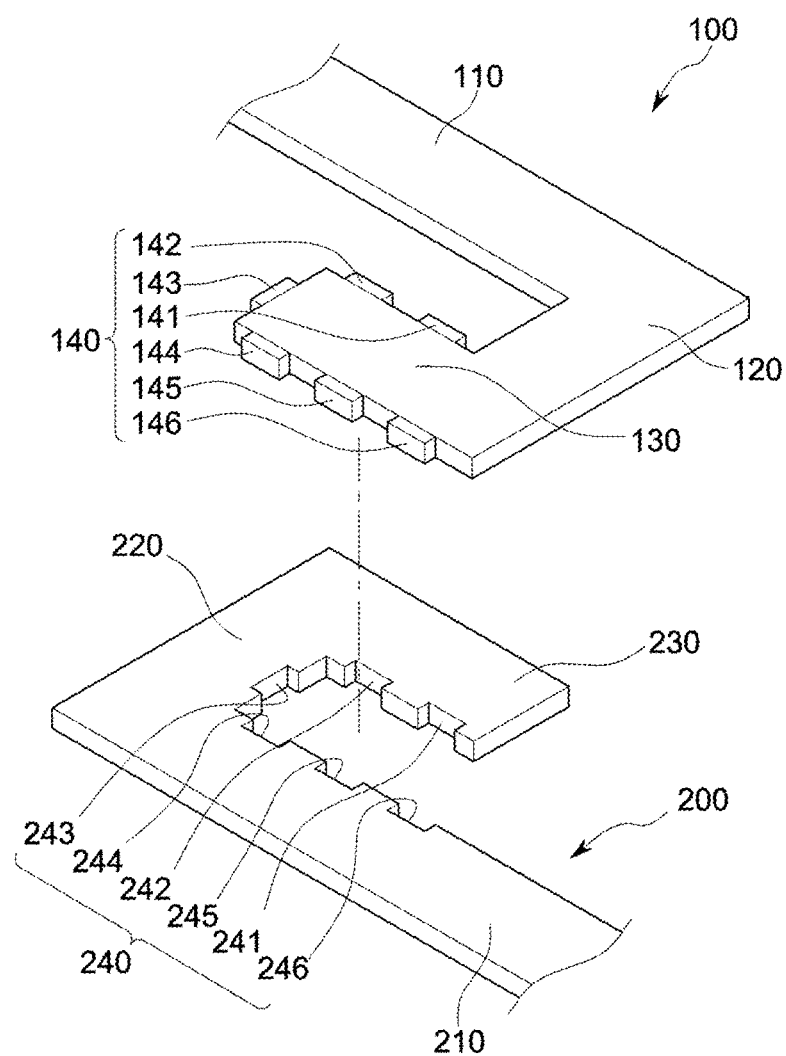
FIG. 3 is a perspective view illustrating a state in which the first gaff-type connection portion and the second gaff-type connection portion of the connector for a display device according to the exemplary embodiment of FIG. 2 are separated from each other.

FIG. 2 is a view illustrating a state in which a first gaff-type connection portion and a second gaff-type connection portion of a connector for a display device according to an exemplary embodiment are fitted to each other, and FIG. 3 is a perspective view illustrating a state in which the first gaff-type connection portion and the second gaff-type connection portion of the connector for a display device according to the exemplary embodiment of FIG. 2 are separated from each other.

Referring to FIGS. 2 and 3, the first gaff-type connection portion 100 may include a first web portion 110 extending from the FPCB 40, a first flange portion 120 bent from the first web portion 110, and a second web portion 130 bent from the first flange portion 120.

In the first gaff-type connection portion 100, an end portion of the first web portion 110 may be bent at a right angle to form the first flange portion 120 so that the first web portion 110 and the first flange portion 120 are integrally provided as a unitary structure, and an end portion (i.e., an end portion opposite to the end portion between the first web portion 110 and the first flange portion 120) of the first flange portion 120 may be bent at a right angle to form the second web portion 130 so that the first flange portion 120 and the second web portion 130 are integrally provided as a unitary structure. In this case, the first web portion 110 and the second web portion 130 face each other at their inner side surfaces. Here, the inner side surface is a side surface disposed at an inner side of the gaff-type structure as shown in FIG. 3.

Although it is illustrated in FIGS. 2 and 3 that the first gaff-type connection portion 100 according to an exemplary embodiment has a structure in which the first web portion 110, the first flange portion 120, and the second web portion 130 are bent at right angles at their connection parts by way of example, the invention is not limited thereto. According to another exemplary embodiment, the first web portion 110, the first flange portion 120, and the second web portion 130 may be bent into a curved line or a different angle at their connection parts to be integrally provided as a unitary structure.

In the first gaff-type connection portion 100, at least one of the first web portion 110, the first flange portion 120 and the second web portion 130 may include a first prominence portion 140 that protrudes from a side portion thereof.

The first prominence portion 140 may include a plurality of first connection terminals 141 to 146 arranged at regular intervals. That is, the first prominence portion 140 may be disposed such that the plurality of first connection terminals 141 to 146 protrudes at regular intervals around a side surface of the second web portion 130.

Although it is exemplified that the first prominence portion 140 including the plurality of first connection terminals 141 to 146 is disposed around the side surface of the second web portion 130, the invention is not limited thereto. According to another exemplary embodiment, the first prominence portion 140 may be disposed at an inner side surface of the first flange portion 120, or at an inner side surface of the first web portion 110.

In another exemplary embodiment, the first prominence portion 140 may be disposed at all of the inner side surface of the first web portion 110, the inner side surface of the first flange portion 120, and the side surface of the second web portion 130.

In an exemplary embodiment, the second gaff-type connection portion 200 may include a third web portion 210 extending from the PCB 20, a second flange portion 220 bent from the third web portion 210, and a fourth web portion 230 bent from the second flange portion 220.

In the second gaff-type connection portion 200, the second flange portion 220 may be disposed, at a right angle, at an end portion of the third web portion 210 so that the third web portion 210 and the second flange portion 220 are integrally provided as a unitary structure, the fourth web portion 230 may be disposed at an end portion (i.e., an end portion opposite to the end portion between the third web portion 210 and the second flange portion 220) of the second flange portion 220 in parallel to the third web portion 210 and the second flange portion 220 and the fourth web portion 230 may be provided as a unitary structure.

Accordingly, the first gaff-type connection portion 100 including the first web portion 110, the first flange portion 120, and the second web portion 130 may be fitted to the second gaff-type connection portion 200 including the third web portion 210, the second flange portion 220 and the fourth web portion 230 into place.

At least one of the third web portion 210, the second flange portion 220 and the fourth web portion 230 may have a first recessed portion 240 that is to be fitted to the first prominence portion 140.

The first recessed portion 240 may include a plurality of first connection recesses 241 to 246 that are arranged at regular intervals to accommodate the plurality of first connection terminals 141 to 146. That is, in the second gaff-type connection portion 200, the plurality of first connection recesses 241 to 246 is defined at regular intervals at the positions contacting the plurality of first connection terminals 141 to 146 of the first prominence portion 140 on inner side surfaces of the third web portion 210, the second flange portion 220 and the fourth web portion 230 as illustrated in FIG. 3. Here, the inner side surfaces of the third web portion 210 and the fourth web portion 230 may face each other.

Although it is exemplified that the first recessed portion 240 is defined on the inner side surfaces of the third web portion 210, the second flange portion 220 and the fourth web portion 230, the invention is not limited thereto. In another exemplary embodiment, the first recessed portion 240 may be defined on an outer side surface of the fourth web portion 230 in the case that the first prominence portion 140 is disposed on the inner side surface of the first web portion 110.

In another exemplary embodiment, the first recessed portion 240 may be defined on the inner side surfaces of the third web portion 210, the second flange portion 220 and the fourth web portion 230, and also defined on the outer side surface of the fourth web portion 230.

Although it is exemplified that each of the plurality of first connection terminals 141 to 146 and the plurality of first connection recesses 241 to 246 has a shape of a quadrangular column, the invention is not limited thereto. In another exemplary embodiment, it may have a shape of a triangular column. In still another exemplary embodiment, each of the plurality of first connection terminals 141 to 146 and the plurality of first connection recesses 241 to 246 may have one of a polygonal columnar shape, a circular columnar shape, and a semicircular columnar shape. In still another exemplary embodiment, the plurality of first connection terminals 141 to 146 may protrude in a shape of a combination of a quadrangle and a circle, and the plurality of first connection recesses 241 to 246 may be recessed in a shape of a combination of a quadrangle and a circle.

The plurality of first connection terminals 141 to 146 and the plurality of first connection recesses 241 to 246 may be coated with a metal including a conductive material for signal transmission.

A thickness (i.e., height) of each of the plurality of first connection terminals 141 to 146 may be less than or substantially equal to a thickness of each of the first web portion 110, the first flange portion 120, and the second web portion 130. That is, each of the plurality of first connection terminals 141 to 146 may have a thickness less than or substantially equal to the thickness of each of the first web portion 110, the first flange portion 120, and the second web portion 130.

Each of the plurality of first connection terminals 141 to 146 may have a thickness less than or substantially equal to a thickness of the first gaff-type connection portion 100 in order to be precisely fitted to the plurality of first connection recesses 241 to 246. In such an exemplary embodiment, the plurality of first connection recesses 241 to 246 has a substantially same shape and a substantially same thickness as those of the plurality of first connection terminals 141 to 146.

Figure 4:
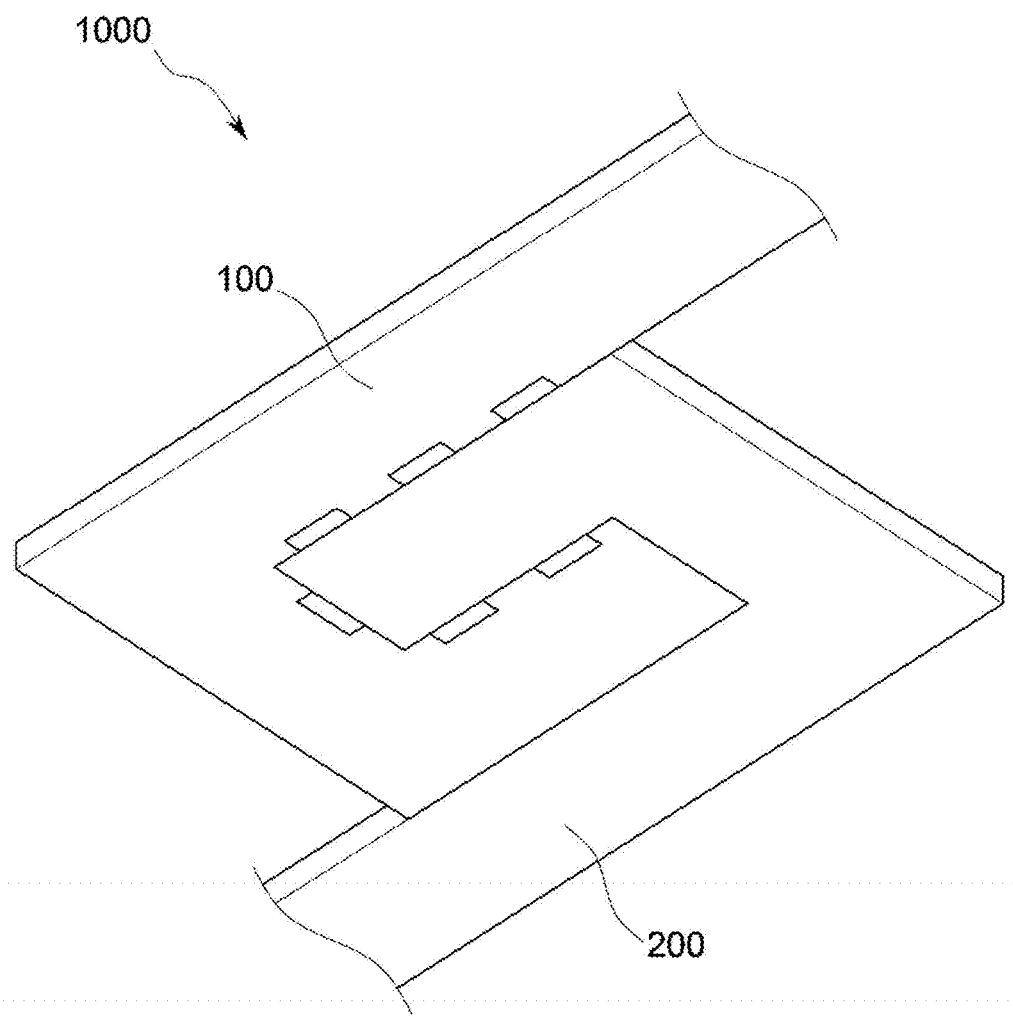
FIG. 4 is a view illustrating a state in which a first gaff-type connection portion and a second gaff-type connection portion of a connector for a display device according to another exemplary embodiment are fitted to each other.
Figure 5:
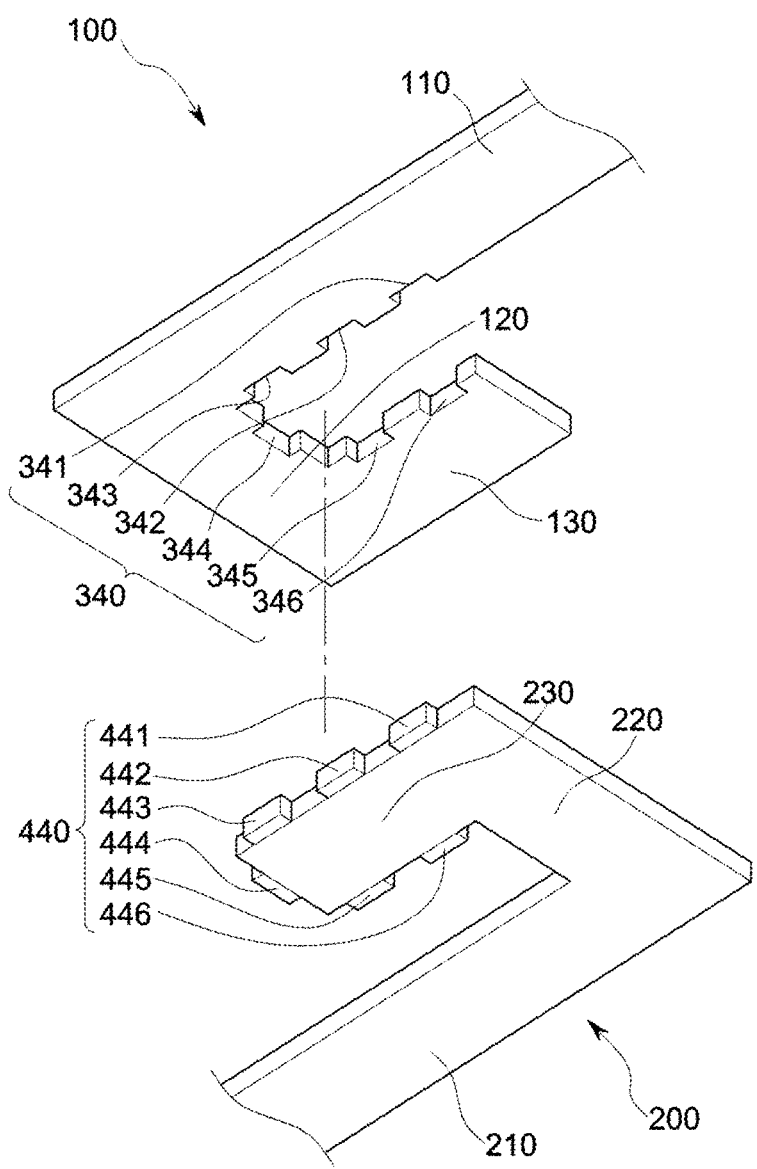
FIG. 5 is a perspective view illustrating a state in which the first gaff-type connection portion and the second gaff-type connection portion of the connector for a display device according to the another exemplary embodiment of FIG. 4 are separated from each other.

FIG. 4 is a view illustrating a state in which a first gaff-type connection portion and a second gaff-type connection portion of a connector for a display device according to another exemplary embodiment are fitted to each other, and FIG. 5 is a perspective view illustrating a state in which the first gaff-type connection portion and the second gaff-type connection portion of the connector for a display device according to the another exemplary embodiment of FIG. 4 are separated from each other.

Referring to FIGS. 4 and 5, in a connector 1000 for a display device according to the another exemplary embodiment, the first gaff-type connection portion 100 may have a second recessed portion 340, and the second gaff-type connection portion 200 may include a second prominence portion 440.

That is, in the first gaff-type connection portion 100, at least one of the first web portion 110, the first flange portion 120 and the second web portion 130 may have the second recessed portion 340 that is recessed at a side portion thereof. The second recessed portion 340 may include a plurality of second connection recesses 341 to 346 that are arranged at regular intervals to accommodate a plurality of second connection terminals 441 to 446.

In addition, in the second gaff-type connection portion 200, at least one of the third web portion 210, the second flange portion 220 and the fourth web portion 230 may include the second prominence portion 440 that protrudes from a side portion thereof and is fitted to the second recessed portion 340. The second prominence portion 440 may include the plurality of second connection terminals 441 to 446 that protrude at regular intervals.

Although it is exemplified that the plurality of second connection recesses 341 to 346 are defined on inner side surfaces of the first web portion 110, the first flange portion 120 and the second web portion 130 in the first gaff-type connection portion 100, the invention is not limited thereto. In another exemplary embodiment, the plurality of second connection recesses 341 to 346 may be defined around outer side surfaces of the first web portion 110, the first flange portion 120 and the second web portion 130.

Although it is exemplified that the plurality of second connection terminals 441 to 446 protrudes around a side surface of the fourth web portion 230 in the second gaff-type connection portion 200, the invention is not limited thereto. In another exemplary embodiment, the plurality of second connection terminals 441 to 446 may protrude from an inner side surface of the third web portion 210 or from an inner side surface of the second flange portion 220, especially in the case that the second web portion 130 has the second connection recesses around the outer side surfaces thereof.

Each of the plurality of second connection terminals 441 to 446 and the plurality of second connection recesses 341 to 346 may have one of a polygonal columnar shape, a circular columnar shape, and a semicircular columnar shape. In another exemplary embodiment, the plurality of second connection terminals 441 to 446 may protrude in a shape of a combination of a quadrangle and a circle, and the plurality of second connection recesses 341 to 346 may be recessed in a shape of a combination of a quadrangle and a circle.

The plurality of second connection terminals 441 to 446 and the plurality of second connection recesses 341 to 346 may be coated with a metal including a conductive material for signal transmission.

A thickness (i.e., height) of each of the plurality of second connection terminals 441 to 446 may be less than or substantially equal to a thickness of each of the third web portion 210, the second flange portion 220, and the fourth web portion 230.

Each of the plurality of second connection terminals 441 to 446 may have a thickness less than or substantially equal to a thickness of the second gaff-type connection portion 200 in order to be precisely fitted to the plurality of second connection recesses 341 to 346. In such an exemplary embodiment, the plurality of second connection recesses 341 to 346 has a substantially same shape and a substantially same thickness as those of the plurality of second connection terminals 441 to 446.

Figure 6:
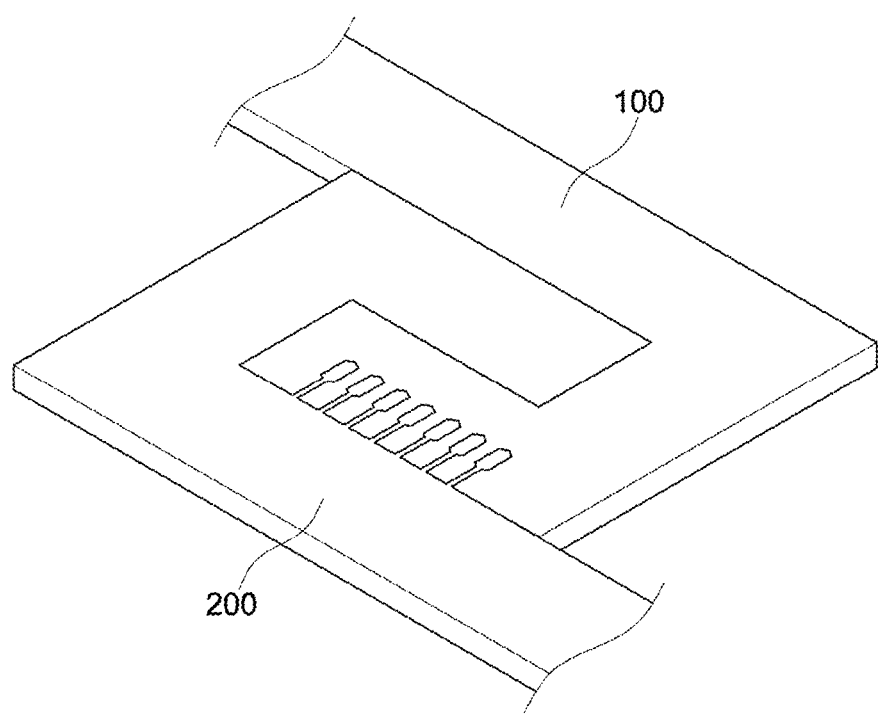
FIG. 6 is a view illustrating a state in which a first gaff-type connection portion and a second gaff-type connection portion of a connector for a display device according to still another exemplary embodiment are fitted to each other.
Figure 7:
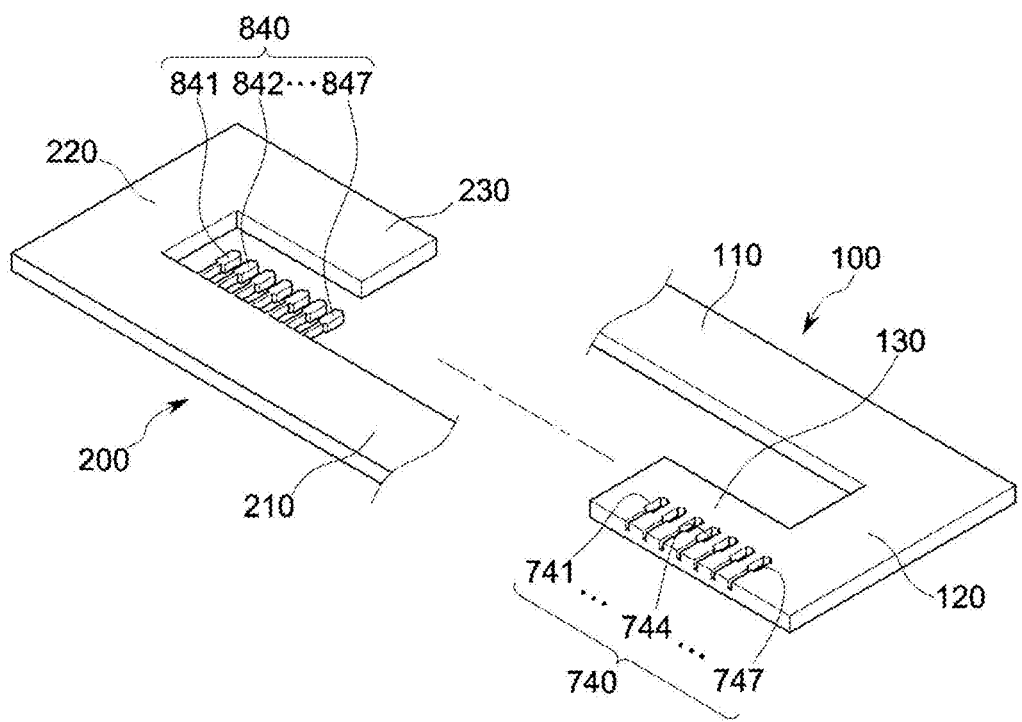
FIG. 7 is a perspective view illustrating a state in which the first gaff-type connection portion and the second gaff-type connection portion of the connector for a display device according to the still another exemplary embodiment of FIG. 6 are separated from each other.

FIG. 6 is a view illustrating a state in which a first gaff-type connection portion and a second gaff-type connection portion of a connector for a display device according to still another embodiment are fitted to each other, and FIG. 7 is a perspective view illustrating a state in which the first gaff-type connection portion and the second gaff-type connection portion of the connector for a display device according to the still another embodiment of FIG. 6 are separated from each other.

Referring to FIGS. 6 and 7, in the first gaff-type connection portion 100 according to the still another exemplary embodiment, at least one of the first web portion 110, the first flange portion 120 and the second web portion 130 may have a fourth recessed portion 740 that is recessed at an upper surface thereof.

In addition, in the second gaff-type connection portion 200 according to the still another exemplary embodiment, at least one of the third web portion 210, the second flange portion 220 and the fourth web portion 230 may include a fourth prominence portion 840 that protrudes from a side surface thereof and is fitted to the fourth recessed portion 740.

The fourth prominence portion 840 may include a plurality of fourth connection terminals 841 to 847 that protrude at regular intervals along the side surface of the third web portion 210. Bottom surfaces of the plurality of fourth connection terminals 841 to 847 may be located at a predetermined height from a bottom of the third web portion 210.

The fourth recessed portion 740 may include a plurality of fourth connection recesses 741 to 747 that are arranged at regular intervals to accommodate the plurality of fourth connection terminals 841 to 847.

Accordingly, when the fourth prominence portion 840 is fitted to the fourth recessed portion 740, the plurality of fourth connection terminals 841 to 847 may be inserted into the plurality of fourth connection recesses 741 to 747, and may electrically connect the first gaff-type connection portion 100 and the second gaff-type connection portion 200 to each other.

The plurality of fourth connection terminals 841 to 847 and the plurality of fourth connection recesses 741 to 747 may be coated with a metal including a conductive material for signal transmission.

Although it is exemplified that each of the plurality of fourth connection terminals 841 to 847 and the plurality of fourth connection recesses 741 to 747 has a shape of a spoon, the invention is not limited thereto. In another exemplary embodiment, it may have one of a polygonal columnar shape, a circular columnar shape, a semicircular columnar shape, and a spoon shape.

In another exemplary embodiment, the plurality of fourth connection terminals 841 to 847 may protrude in a shape of a combination of a quadrangle and a circle, and the plurality of fourth connection recesses 741 to 747 may be recessed in a shape of a combination of a quadrangle and a circle.

Figure 8:
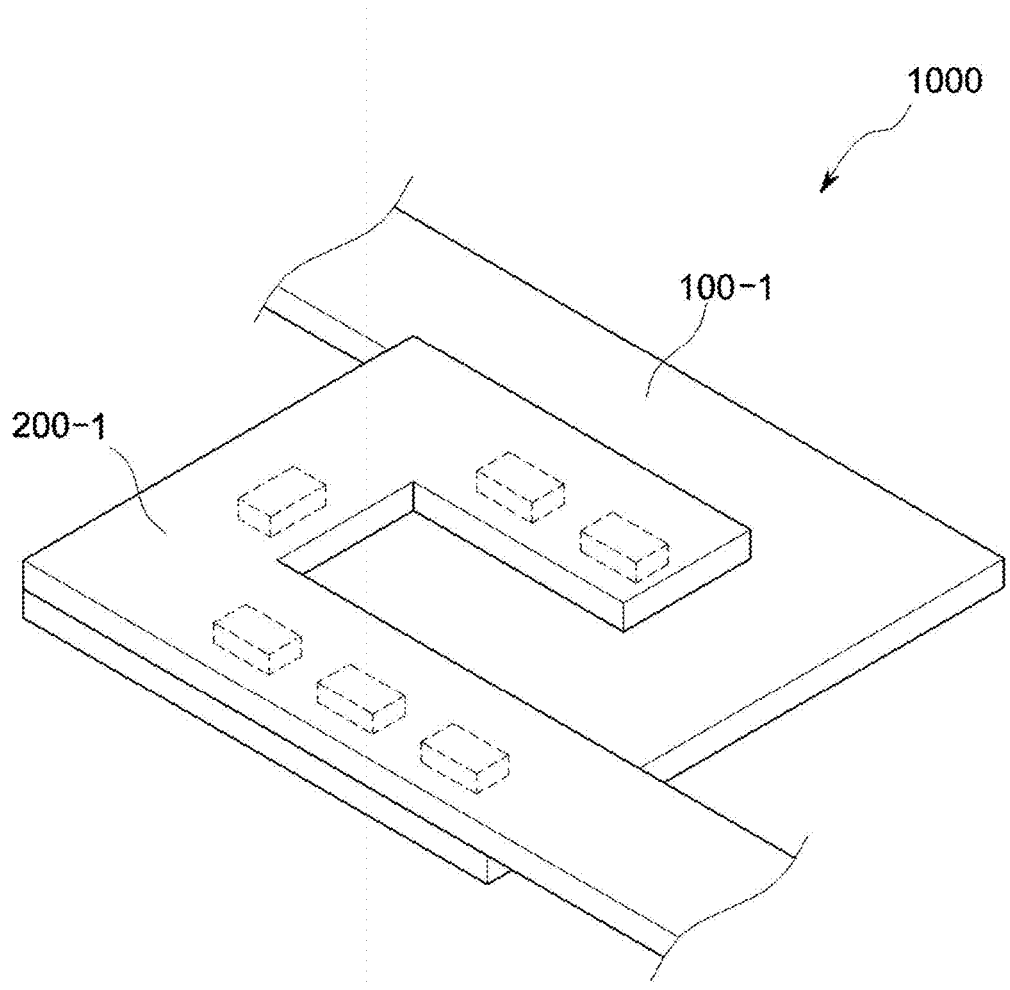
FIG. 8 is a view illustrating a state in which a first connection portion and a second connection portion of a connector for a display device according to still another exemplary embodiment are fitted to each other.
Figure 9:
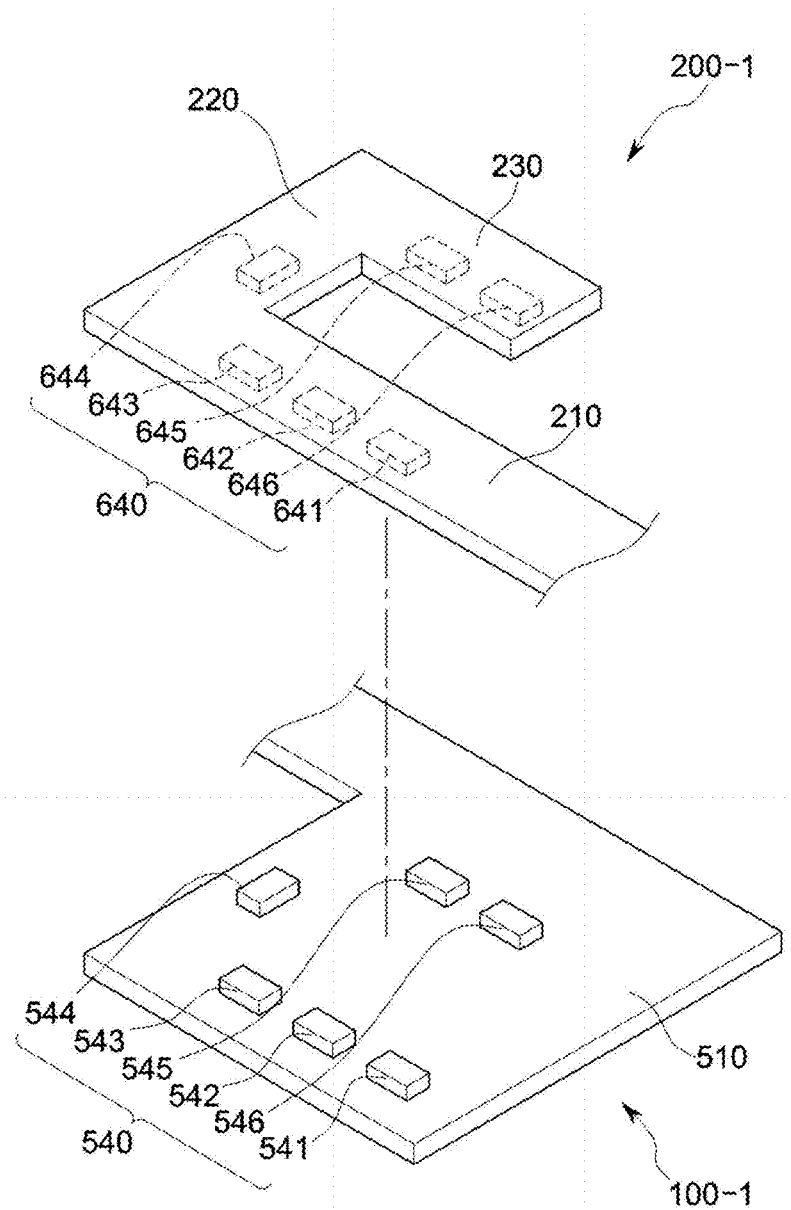
FIG. 9 is a perspective view illustrating a state in which the first connection portion and the second connection portion of the connector for a display device according to the still another exemplary embodiment of FIG. 8 are separated from each other.

FIG. 8 is a view illustrating a state in which a first connection portion and a second connection portion of a connector for a display device according to still another exemplary embodiment are fitted to each other, and FIG. 9 is a perspective view illustrating a state in which the first connection portion and the second connection portion of the connector for a display device according to the still another exemplary embodiment of FIG. 8 are separated from each other.

Referring to FIGS. 8 and 9, a connector 1000 for a display device according to the still another exemplary embodiment includes a first connection portion 100-1 that is disposed at the FPCB 40, and a second connection portion 200-1 that is disposed at the PCB 20 and fitted to the first connection portion 100-1.

In such an exemplary embodiment, one of the first connection portion 100-1 and the second connection portion 200-1 may include a third prominence portion 540 arranged at regular intervals, and the other of the first connection portion 100-1 and the second connection portion 200-1 may have an accommodation recessed portion 640 that accommodates the third prominence portion 540.

Each of the first connection portion 100-1 and the second connection portion 200-1 may have one of a plate shape and a gaff shape. For example, the first connection portion 100-1 may have a plate shape, and the second connection portion 200-1 may have a gaff shape, as illustrated in FIG. 9.

The first connection portion 100-1 may include an extension portion 510 that extends from the FPCB 40 and the third prominence portion 540 that protrudes from the extension portion 510 and arranged at regular intervals.

The extension portion 510 may have, for example, a quadrangular shape, and may have a predetermined planar area overlapping the second connection portion 200-1. Although it is exemplified in FIG. 9 that the extension portion 510 has a quadrangular shape, but the invention is not limited thereto. In another exemplary embodiment, the extension portion 510 may have a circular shape or a polygonal shape.

The third prominence portion 540 may include a plurality of third connection terminals 541 to 546 that protrude from an upper surface of the extension portion 510 and arranged at regular intervals in a gaff shape.

The second connection portion 200-1 may include a third web portion 210 extending from the PCB 20, a second flange portion 220 bent from the third web portion 210, a fourth web portion 230 bent from the second flange portion 220, and the accommodation recessed portion 640 that accommodates the third prominence portion 540 and defined in lower surfaces of the third web portion 210, the second flange portion 220 and the fourth web portion 230.

Accordingly, the third prominence portion 540 of the first connection portion 100-1 may be fitted to the accommodation recessed portion 640 of the second connection portion 200-1.

The accommodation recessed portion 640 may include a plurality of third connection recesses 641 to 646 arranged at regular intervals and accommodating the plurality of third connection terminals 541 to 546. In an exemplary embodiment, each of the plurality of third connection recesses 641 to 646 has, for example, a quadrangular shape, and accommodates each corresponding one of the plurality of third connection terminals 541 to 546 that has a quadrangular column shape. In addition, the plurality of third connection recesses 641 to 646 may be defined at the third web portion 210, the second flange portion 220 and the fourth web portion 230 at regular intervals, corresponding to the plurality of third connection terminals 541 to 546. In such an exemplary embodiment, upper surfaces of the third web portion 210, the second flange portion 220, and the fourth web portion 230 may be in a planar shape through which each of the third connection recesses 641 to 646 does not pass.

The first connection portion 100-1 is electrically connected to the second connection portion 200-1 by inserting the plurality of third connection terminals 541 to 546 into the plurality of third connection recesses 641 to 646.

The plurality of third connection terminals 541 to 546 and the plurality of third connection recesses 641 to 646 may be coated with a metal including a conductive material for signal transmission.

Although it is exemplified that each of the plurality of third connection terminals 541 to 546 and the plurality of third connection recesses 641 to 646 has a quadrangular column shape, as illustrated in FIG. 9, the invention is not limited thereto. In an exemplary embodiment, it may have a different shape. For example, each of the plurality of third connection terminals 541 to 546 and the plurality of third connection recesses 641 to 646 may have one of a polygonal columnar shape, a circular columnar shape, and a semicircular columnar shape. In another exemplary embodiment, the plurality of third connection terminals 541 to 546 may protrude in a shape of a combination of a quadrangle and a circle, and the plurality of third connection recesses 641 to 646 may be recessed in a shape of a combination of a quadrangle and a circle.

Each of the plurality of third connection terminals 541 to 546 may have a thickness (i.e., height) substantially equal to a depth of each of the plurality of third connection recesses 641 to 646. This is to insert the plurality of third connection terminals 541 to 546 into the plurality of third connection recesses 641 to 646 precisely and obtain good electric connection.

Figure 10:
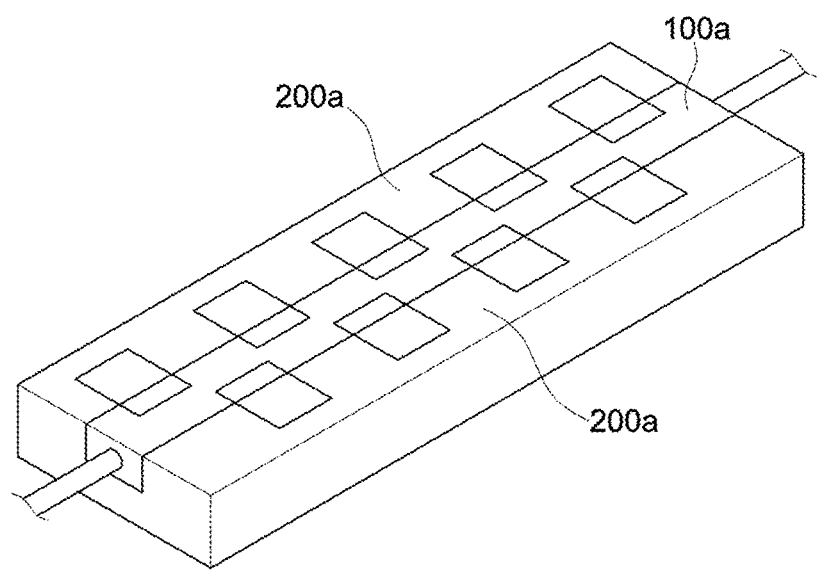
FIG. 10 is a view illustrating a state in which a first flat-type connection portion and a second flat-type connection portion of a connector for a display device according to a fifth exemplary embodiment are fitted to each other.
Figure 11:
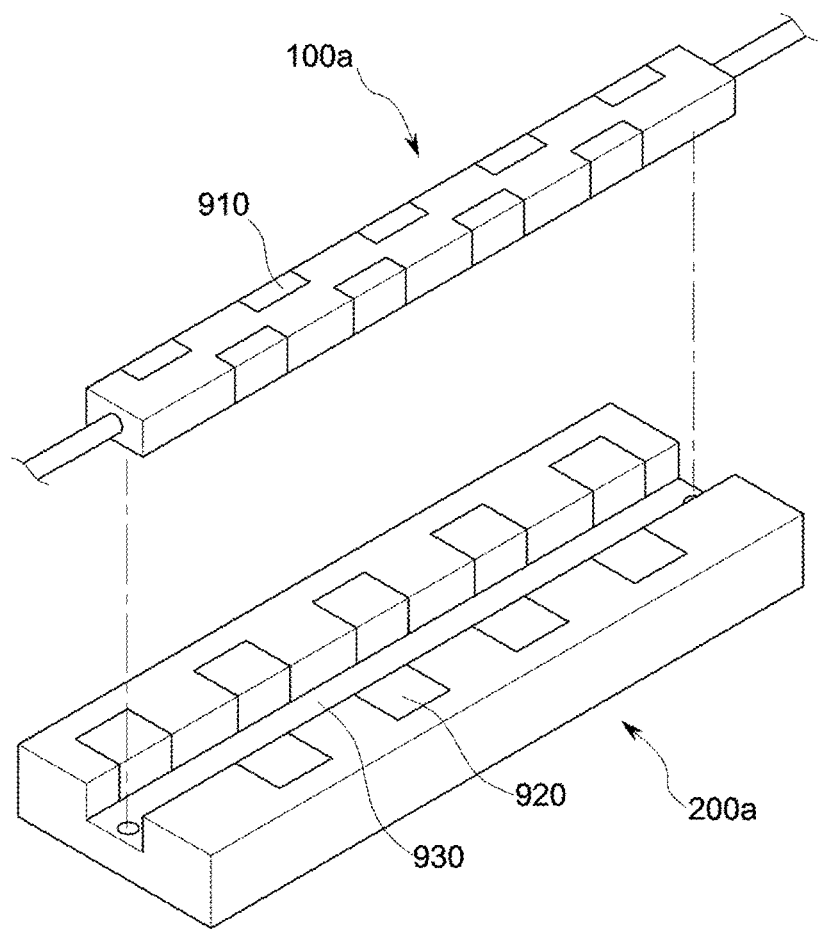
FIG. 11 is a perspective view illustrating the first flat-type connection portion and the second flat-type connection portion of the connector for a display device according to a fifth exemplary embodiment are separated from each other.

FIG. 10 is a view illustrating a state in which a first flat-type connection portion and a second flat-type connection portion of a connector for a display device according to still another exemplary embodiment are fitted to each other, and FIG. 11 is a perspective view illustrating a state in which the first flat-type connection portion and the second flat-type connection portion of the connector for a display device according to the still another exemplary embodiment of FIG. 10 are separated from each other.

Referring to FIGS. 10 and 11, a connector for a display device according to the still another exemplary embodiment may include a first flat-type connection portion 100a and a second flat-type connection portion 200a.

The first flat-type connection portion 100a may include a plurality of fifth connection terminals 910 arranged on at least one side thereof at regular intervals along a longitudinal direction of the first flat-type connection portion 100a.

The plurality of fifth connection terminals 910 may be arranged at regular intervals along the longitudinal direction in an alternating manner on one side and an opposite side of the first flat-type connection portion 100a. That is, each of the plurality of fifth connection terminals 910 may have a shape extending from an upper surface of the first flat-type connection portion 100a having a rectangular parallelepiped shape, to a side surface thereof, and may be arranged alternately at regular intervals as illustrated in FIG. 11. In such an exemplary embodiment, the plurality of fifth connection terminals 910 are alternately arranged so that one of the fifth connection terminals 910 that are arranged on one side of the first flat-type connection portion 100a at regular intervals along the longitudinal direction is disposed between two of the fifth connection terminals 910 that are arranged at regular intervals along the longitudinal direction on another side of the first flat-type connection portion 100a that opposes the one side in a width direction perpendicular to the longitudinal direction.

In the second flat-type connection portion 200a, an accommodation recess 930 that accommodates the first flat-type connection portion 100a is defined along a longitudinal direction of the second flat-type connection portion 200a. In addition, the second flat-type connection portion 200a may include, in the accommodation recess 930, a plurality of sixth connection terminals 920 to contact the plurality of fifth connection terminals 910.

In such an exemplary embodiment, the plurality of fifth connection terminals 910 and the plurality of sixth connection terminals 920 may be coated with a metal including a conductive material.

In an exemplary embodiment, the plurality of sixth connection terminals 920 are arranged so that one of the sixth connection terminals 920 that are arranged on one inner side of the second flat-type connection portion 200a at regular intervals along the longitudinal direction is disposed between two of the sixth connection terminals 920 that are arranged at regular intervals in the longitudinal direction on another inner side of the second flat-type connection portion 200a that opposes the one inner side in a width direction perpendicular to the longitudinal direction.

A height and a width (i.e., length along the longitudinal direction) of the fifth connection terminal 910 may be substantially equal to a height and a width of the sixth connection terminal 920, respectively, for electrical connection.

The first flat-type connection portion 100a has a width (i.e., length along the longitudinal direction) greater than that of the accommodation recess 930. This is to maintain a fitted state between the first flat-type connection portion 100a and the second flat-type connection portion 200a after they are fitted to each other, and to prevent them from being separated from each other.

The first flat-type connection portion 100a may have a thickness (i.e., height) greater than or substantially equal to a depth of the accommodation recess 930 to obtain good electrical connection between the plurality of fifth connection terminals 910 and the plurality of sixth connection terminals 920.

Figure 12:
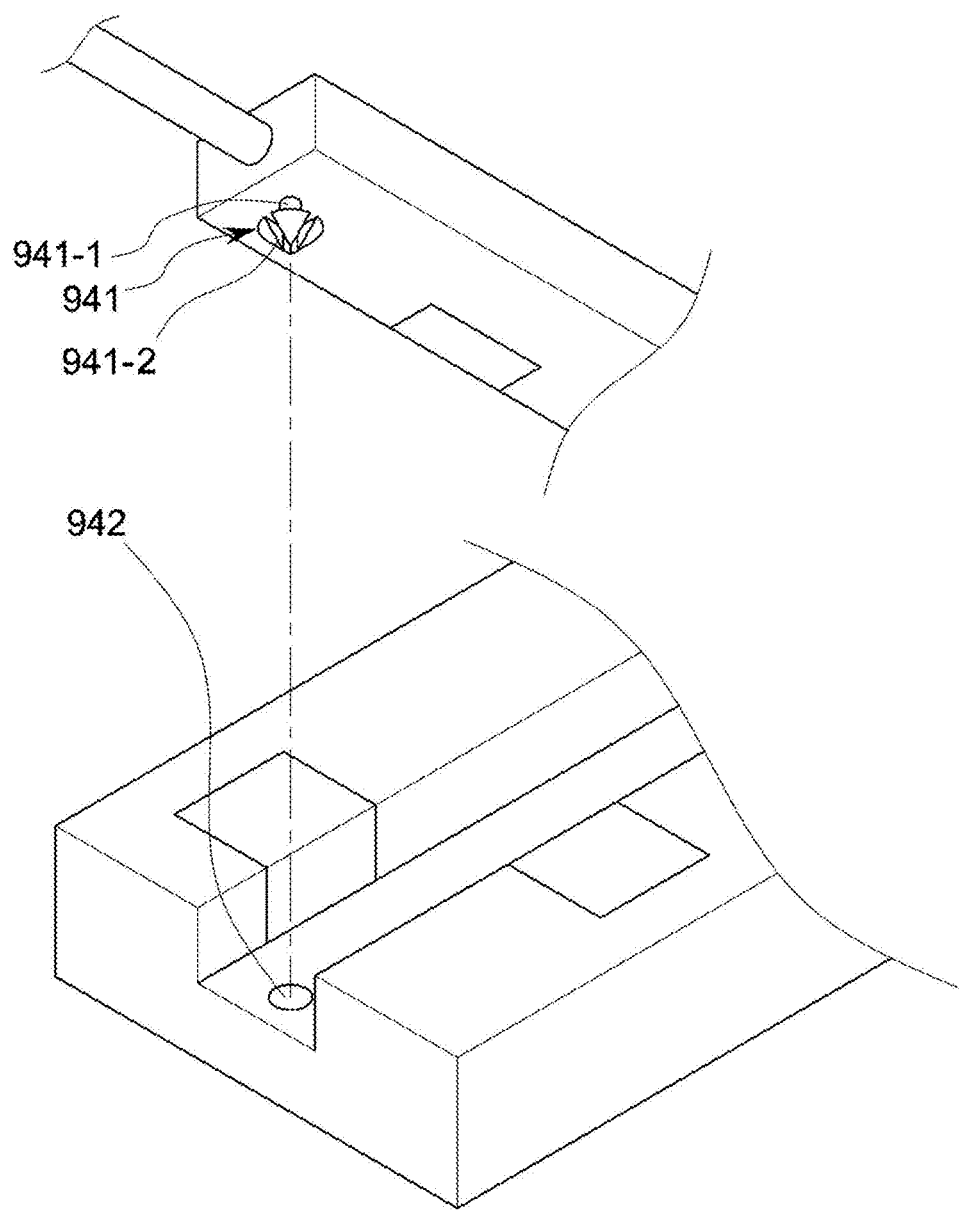
FIGS. 12 and 13 are views illustrating a state in which a first flat-type connection portion and a second flat-type connection portion according to an exemplary embodiment are fitted to each other.
Figure 13:
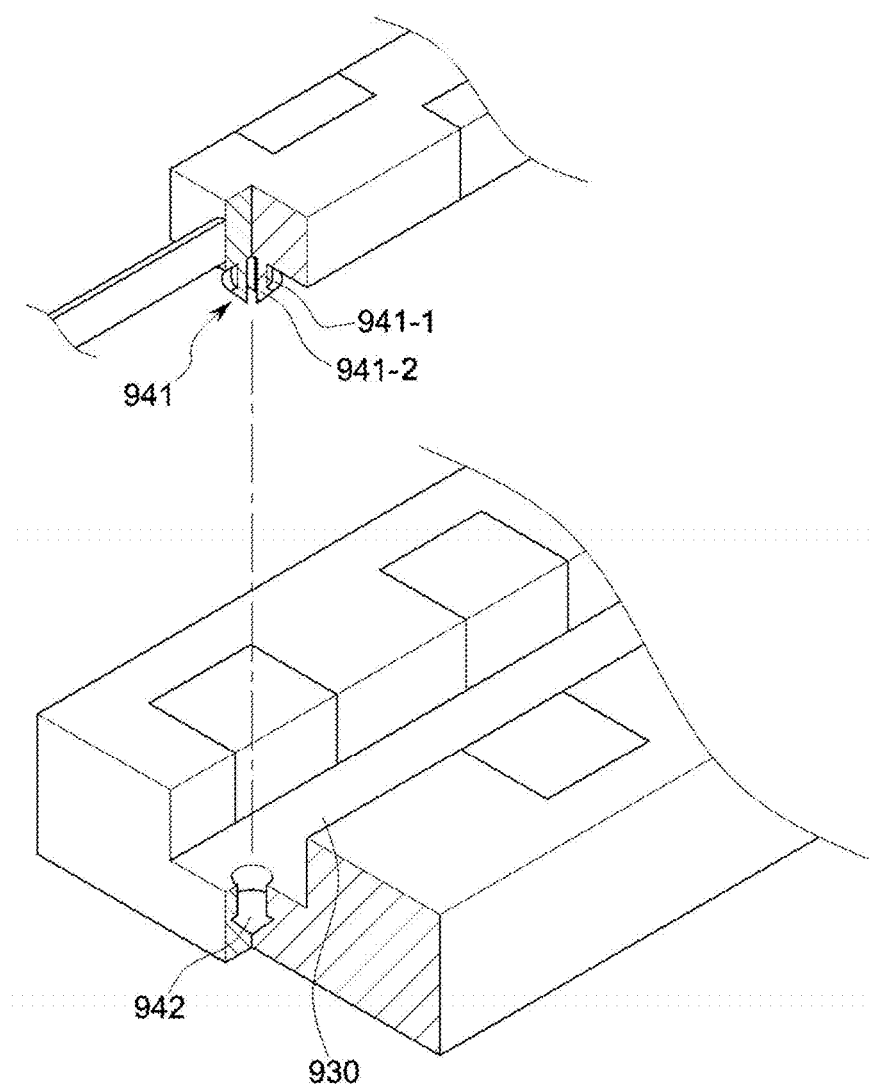

The connector for a display device according to this exemplary embodiment may further include a securing portion 941 to maintain a state where the first flat-type connection portion 100a is accommodated at the second flat-type connection portion 200a, as illustrated in FIGS. 12 and 13. FIGS. 12 and 13 are views illustrating a state in which the first flat-type connection portion 100a and the second flat-type connection portion 200a of a connector for a display device according to still another exemplary embodiment are fitted to each other. The first flat-type connection portion 100a is inserted into the accommodation recess 930 and is fitted to the second flat-type connection portion 200a. As illustrated in FIGS. 12 and 13, the securing portion 941 may be provided to protrude from one of the first flat-type connection portion 100a and the second flat-type connection portion 200a.

In addition, the other of the first flat-type connection portion 100a and the second flat-type connection portion 200a may have a securing hole 942 for accommodating the securing portion 941.

The securing portion 941 may include a supporter 941-1 that protrudes from a lower surface of the first flat-type connection portion 100a, and an elastic sub-securing portion 941-2 that extends from the supporter 941-1 and has a diameter decreasing along a direction away from the first flat-type connection portion 100a as illustrated in FIG. 12, for example.

When the first flat-type connection portion 100a is inserted into the accommodation recess 930 of the second flat-type connection portion 200a, the supporter 941-1 and the elastic sub-securing portion 941-2 are inserted into the securing hole 942.

The elastic sub-securing portion 941-2 contracts in the securing hole 942, and after the elastic sub-securing portion 941-2 passes through the securing hole 942 to protrude to an outside of the second flat-type connection portion 200a opposite to the surface of the second flat-type connection portion 200a facing the first flat-type connection portion 100a, the elastic sub-securing portion 941-2 expands to lock at the securing hole 942. Accordingly, the securing portion 941 maintains a state in which the first flat-type connection portion 100a is accommodated at the second flat-type connection portion 200a.

In such a state, the supporter 941-1 is disposed in the securing hole 942, and the elastic sub-securing portion 941-2 protrudes from one surface of the second flat-type connection portion 200a.

As such, according to an exemplary embodiment, it is possible to visually identify a connection failure between the FPCB and the PCB that are used in display devices, e.g., a tablet and a smart phone.

As set forth hereinabove, according to one or more exemplary embodiments, it is possible to identify a connection failure between the FPCB and the PCB of the connector for a display device by appearance instantaneously at the time of manufacturing a display device to which a touch sensing panel is applied.

Accordingly, when a connection failure occurs, a defective FPCB may be replaced with a non-defective FPCB, and thus it is possible to manufacture a connector for a display device that may operate normally.

While the invention has been illustrated and described with reference to the exemplary embodiments thereof, it will be apparent to those of ordinary skill in the art that various changes in form and detail may be made thereto without departing from the spirit and scope of the invention.

What is claimed is:

1. A connector for a display device, the connector comprising:
   a first gaff-shaped connection portion disposed at one end portion of a flexible printed circuit board; and
   a second gaff-shaped connection portion disposed at one end portion of a printed circuit board and fitted to the first gaff-shaped connection portion,
   wherein a first major surface plane defining an entirety of the first gaff-shaped connection portion in a top plan view is coplanar with second major surface plane defining an entirety of the second gaff-shaped connection portion in the top plan view when the first gaff-shaped connection portion and the second gaff-shaped connection portion are fitted together.

2. The connector for a display device of claim 1, wherein the first gaff-shaped connection portion comprises a first web portion which extends from the flexible printed circuit board, a first flange portion bent from the first web portion, and a second web portion bent from the first flange portion,
   the second gaff-shaped connection portion comprises a third web portion which extends from the printed circuit board, a second flange portion bent from the third web portion, and a fourth web portion bent from the second flange portion, and
   the first web portion, the first flange portion, and the second web portion are fitted to the third web portion, the second flange portion, and the fourth web portion.

3. The connector for a display device of claim 2, wherein at least one of the first web portion, the first flange portion, and the second web portion comprises a first prominence portion which protrudes from a side surface thereof, and
   at least one of the third web portion, the second flange portion, and the fourth web portion defines a first recessed portion fitted to the first prominence portion.

4. The connector for a display device of claim 3, wherein the first prominence portion comprises a plurality of first connection terminals arranged at first regular intervals, and
   the first recessed portion comprises a plurality of first connection recesses arranged at the first regular intervals and which accommodates the plurality of first connection terminals.

5. The connector for a display device of claim 4, wherein each of the plurality of first connection terminals and the plurality of first connection recesses has one of a polygonal columnar shape, a circular columnar shape, and a semicircular columnar shape.

6. The connector for a display device of claim 4, wherein each of the plurality of first connection terminals and the plurality of first connection recesses is coated with a metal including a conductive material.

7. The connector for a display device of claim 4, wherein a thickness of each of the plurality of first connection terminals is less than or substantially equal to a thickness of each of the first web portion, the first flange portion, and the second web portion.

8. The connector for a display device of claim 2, wherein at least one of the first web portion, the first flange portion, and the second web portion defines a second recessed portion recessed at a side surface thereof, and
   at least one of the third web portion, the second flange portion, and the fourth web portion comprises a second prominence portion which protrudes from a side surface thereof and is fitted to the second recessed portion.

9. The connector for a display device of claim 8, wherein the second prominence portion comprises a plurality of second connection terminals which protrudes and is arranged at second regular intervals, and
   the second recessed portion comprises a plurality of second connection recesses arranged at the second regular intervals and which accommodates the plurality of second connection terminals.

10. The connector for a display device of claim 2, wherein at least one of the first web portion, the first flange portion, and the second web portion defines a fourth recessed portion recessed at an upper surface thereof, and
    at least one of the third web portion, the second flange portion, and the fourth web portion comprises a fourth prominence portion which protrudes from a side portion thereof and is fitted to the fourth recessed portion.

11. The connector for a display device of claim 10, wherein the fourth prominence portion comprises a plurality of fourth connection terminals which protrudes and is arranged at fourth regular intervals, and
    the fourth recessed portion comprises a plurality of fourth connection recesses arranged at the fourth regular intervals and which accommodates the plurality of fourth connection terminals.

12. The connector for a display device of claim 11, wherein a thickness of each of the plurality of fourth connection terminals is less than a thickness of each of the third web portion, the second flange portion, and the fourth web portion.

13. A connector for a display device, the connector comprising:
    a first connection portion disposed at a flexible printed circuit board; and
    a second connection portion disposed at a printed circuit board and fitted to the first connection portion,
    wherein a first major surface plane defining an entirety of the first connection portion in a top plan view is coplanar with second major surface plane defining an entirety of the second connection portion in the top plan view when the first connection portion and the second connection portion are fitted together,
    wherein one of the first connection portion and the second connection portion comprises a third prominence portion arranged at regular intervals, and
    the other of the first connection portion and the second connection portion defines an accommodation recessed portion for accommodating the third prominence portion,
    wherein each of the first connection portion and the second connection portion has one of a plate shape and a gaff shape,
    wherein the first connection portion comprises an extension portion which extends from the flexible printed circuit board and has a plate shape, the second connection portion comprises a third web portion which extends from the printed circuit board, a second flange portion bent from the third web portion, and a fourth web portion bent from the second flange portion, and defines the accommodation recessed portion for accommodating the third prominence portion on the third web portion, the second flange portion, and the fourth web portion, and the third prominence portion is fitted to the accommodation recessed portion.

14. The connector for a display device of claim 13, wherein the third prominence portion comprises a plurality of third connection terminals which protrudes and is arranged at third regular intervals on the extension portion, and the accommodation recessed portion comprises a plurality of third connection recesses arranged at third regular intervals and which accommodates the plurality of third connection terminals.

15. A connector for a display device, the connector comprising:

a first flat-shaped connection portion which comprises a plurality of fifth connection terminals arranged on at least one side thereof at fifth regular intervals along a longitudinal direction; and a second flat-shaped connection portion which defines an accommodation recess for accommodating the first flat-shaped connection portion, an entirety of the first flat-shaped connection portion is coplanar with the second flat-shaped connection portion, and comprises a plurality of sixth connection terminals in the accommodation recess, the plurality of sixth connection terminals contacting the plurality of fifth connection terminals.

16. The connector for a display device of claim 15, wherein the fifth connection terminals are arranged at the fifth regular intervals along the longitudinal direction in an alternating manner on one side and an opposite side of the first flat-shaped connection portion.

17. The connector for a display device of claim 15, wherein a height and a width of the fifth connection terminal are substantially equal to a height and a width of the sixth connection terminal, respectively.

18. The connector for a display device of claim 15, wherein a width of the first flat-shaped connection portion along the longitudinal direction is greater than a width of the accommodation recess along the longitudinal direction.

19. The connector for a display device of claim 15, wherein a thickness of the first flat-shaped connection portion is greater than or substantially equal to a depth of the accommodation recess.

20. The connector for a display device of 15, further comprising:

a securing portion which protrudes from one of the first flat-shaped connection portion and the second flat-shaped connection portion; and a securing hole defined at the other of the first flat-shaped connection portion and the second flat-shaped connection portion and accommodates the securing portion.

21. The connector for a display device of claim 20, wherein the securing portion comprises:

a supporter which protrudes from one side of the first flat-shaped connection portion; and an elastic sub-securing portion which extends from the supporter and has a diameter which decreases along a direction away from the first flat-shaped connection portion.

22. The connector for a display device of claim 21, wherein the supporter is disposed in the securing hole, and the elastic sub-securing portion protrudes from one surface of the second flat-shaped connection portion.

\* \* \* \* \*